US011672085B2

(12) United States Patent
Ega

(10) Patent No.: US 11,672,085 B2
(45) Date of Patent: Jun. 6, 2023

(54) APPARATUS FOR ALIGNING VISUAL DISPLAYS

(71) Applicant: Nayib Ega, Briarwood, NY (US)

(72) Inventor: Nayib Ega, Briarwood, NY (US)

( * ) Notice: Subject to any disclaimer, the term of this patent is extended or adjusted under 35 U.S.C. 154(b) by 0 days.

(21) Appl. No.: 17/525,223

(22) Filed: Nov. 12, 2021

(65) Prior Publication Data

US 2022/0141972 A1 May 5, 2022

Related U.S. Application Data

(60) Provisional application No. 63/109,291, filed on Nov. 3, 2020.

(51) Int. Cl.
*H05K 5/00* (2006.01)
(52) U.S. Cl.
CPC .................... *H05K 5/0021* (2013.01)

(58) Field of Classification Search
USPC ................ 361/730, 807, 809, 810
See application file for complete search history.

(56) References Cited

U.S. PATENT DOCUMENTS

2016/0081214 A1* 3/2016 Dai ................ F16M 13/02
361/784

FOREIGN PATENT DOCUMENTS

| CN | 210805022 | * | 6/2020 | ............ G09F 9/00 |
| CN | 212084534 | * | 12/2020 | ............ G09F 7/20 |
| CN | 212364899 | * | 1/2021 | ............ G06F 1/16 |
| CN | 213751733 | * | 7/2021 | ............ G09F 9/33 |
| CN | 216556059 | * | 5/2022 | ............ G09F 9/302 |

* cited by examiner

*Primary Examiner* — Hung S. Bui

(57) ABSTRACT

The present disclosure refers to an apparatus for aligning at least two visual display monitors. A symmetrical pair of pads are joined by a linkage that allows for angular and lateral adjustment and are configured to be affixed to the surfaces of monitors for adjusting and bracing the monitors in a chosen orientation relative to each other.

5 Claims, 5 Drawing Sheets

APPARATUS FOR ALIGNING VISUAL DISPLAYS

TECHNICAL FIELD

The invention relates in general to mounting apparatuses for positioning electronic display monitors and more particularly to an apparatus for aligning the vertical and horizontal position of one display monitor to another.

BACKGROUND

Modern computer workstations often employ multiple computer monitors. These monitors can be adjusted to tilt, rise or descend. Two or more monitors side by side on a desk or tabletop may end up oriented differently in height and angle. It becomes effortful to align these multiple monitors by adjusting both heights and angles to be parallel, proximate, and on the same plane.

Existing devices which adjust multiple monitors are designed with adjustable joints that often fail. Additionally, because they use semi-permanent fasteners, the supporting apparatuses of current computer monitors do not offer means for readily detaching a monitor.

A cylindrical joint is a combination of a prismatic and a revolute joint. It allows linear motion along an axis as well as rotation about that axis. A cylindrical joint allows only translation over a plane and rotation about an axis normal to this plane.

SUMMARY

The present disclosure refers to an apparatus for aligning at least two visual display monitors (referred to in short as "monitors"). It provides a means for positioning more than one monitor in equal orientation with the aim of allowing proper body posture and line-of-sight levels. The apparatus is configured to be affixed to the surfaces of two or more monitors so that the monitors may be adjusted to an equal orientation.

Drawings are designed to illustrate rather than limit the invention.

DESCRIPTION

Figure 1:
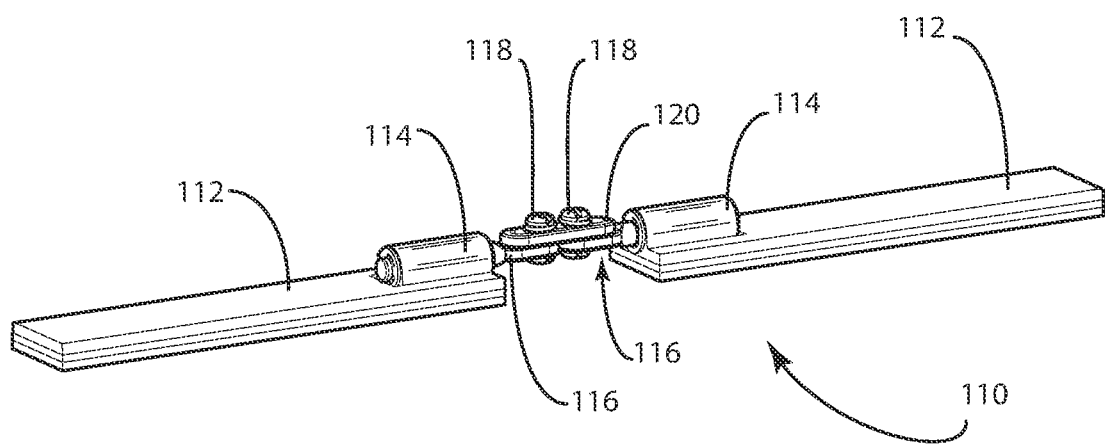
FIG. 1 is a perspective view of an example embodiment of the present disclosure.
Figure 2:
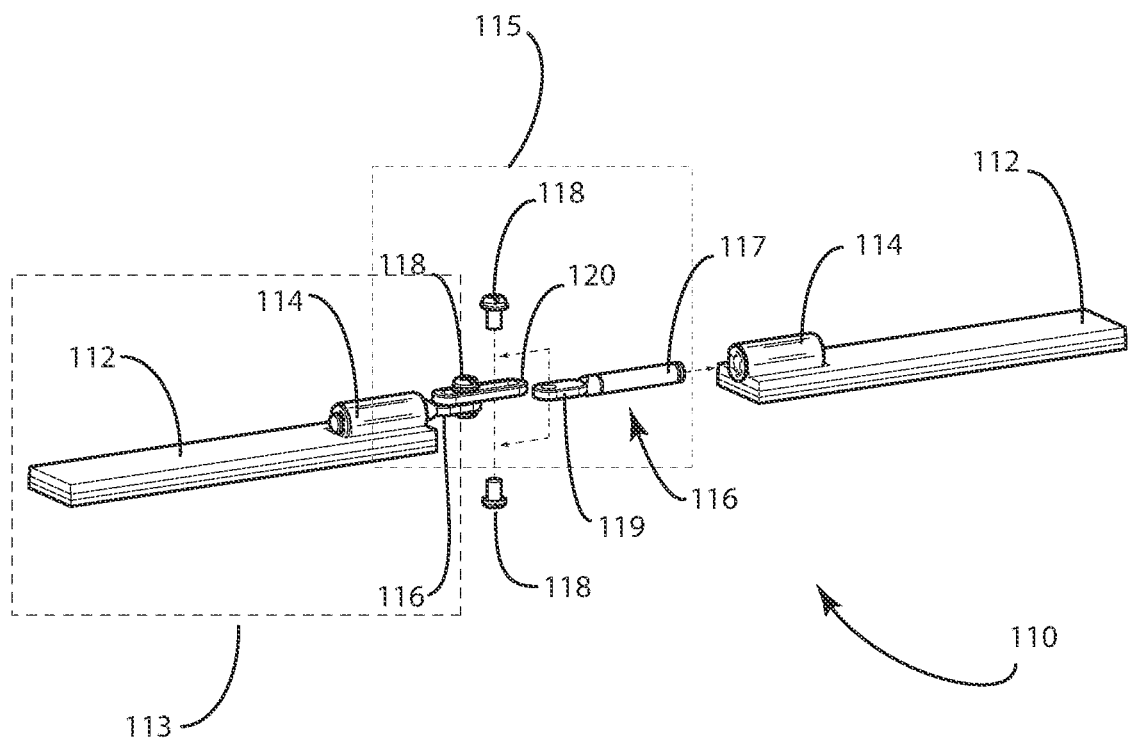
FIG. 2 is perspective, partially exploded view thereof.

FIGS. 1 and 2: A removable apparatus for joining, aligning and orienting flat objects 110 is a linked bracing device which consists of two or more identical, flat braces 112 that are removably fastenable (for example with hook-and-loop fastening) to flat objects (such as computer monitors) desired to be joined. Each brace has at its medial end a cylindrical joint 113 which communicates with a single, central planar joint 115.

The central planar joint 115 has rods 116 that have a cylindrical portion 117 and a flat portion 119. The flat portion has a through-hole 114 that mates with a linking member 120 which receives a fastening screw 118. The planar joint 115 joins the medial ends of these rods 116 by the use of at least one fastener 118. Substantially symmetrical braces 112 each have a through-hole 114 receiving the cylindrical portion 117 of the rods 116 of the central planar joint 115. One skilled in the art is familiar with planar joints of this type.

The linking member 120 of the central planar joint 115 has a slot on its long axis for fasteners 118. One skilled in the art understands that the fasteners 118 through the linking member 120 and through the rods 116 enable lateral adjustment on the long axis of the linking member 120 and for pivotal adjustment on the vertical axis of rods 116.

Figure 3:
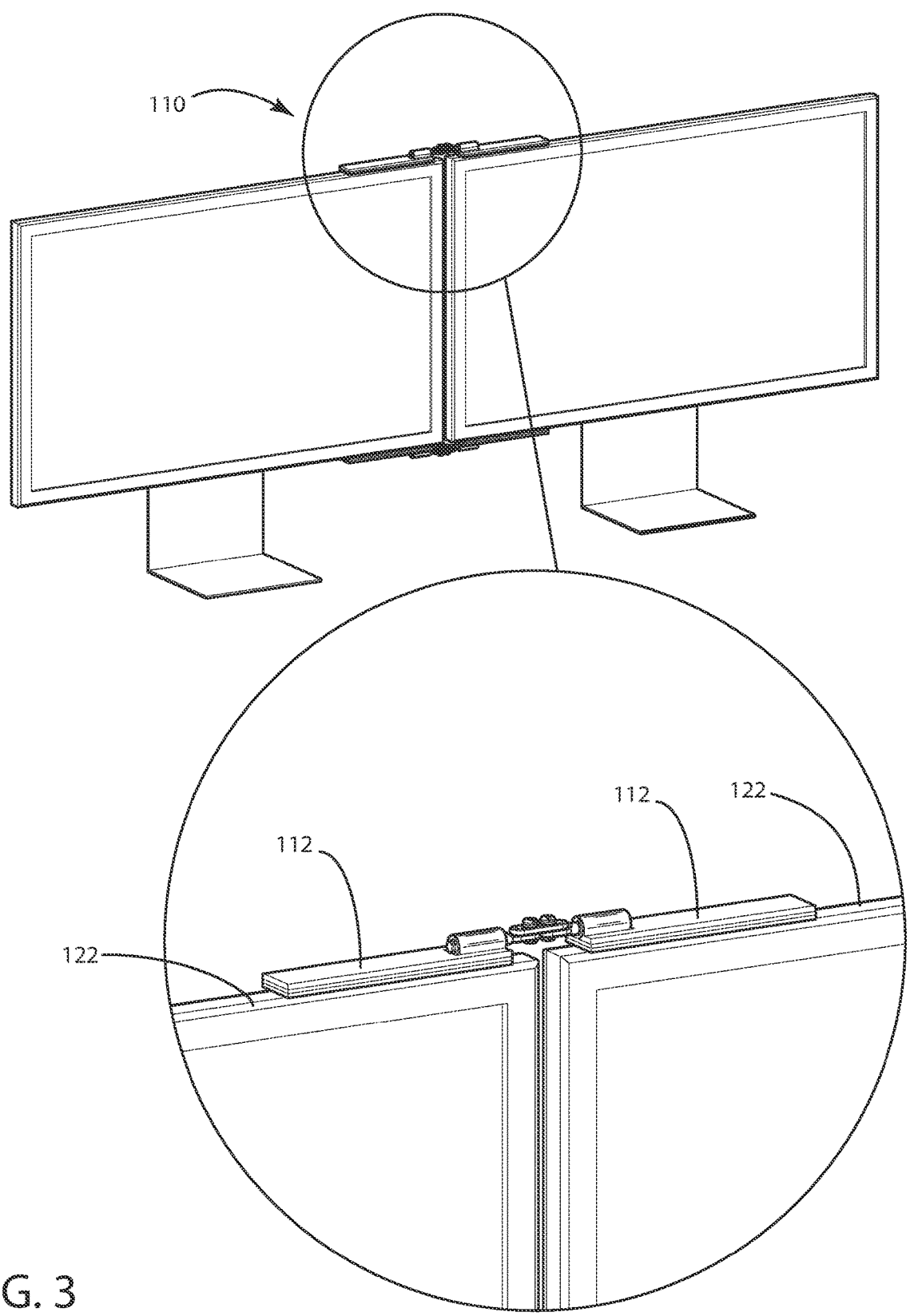
FIG. 3 is a perspective view of the example embodiment in situ.
Figure 4:
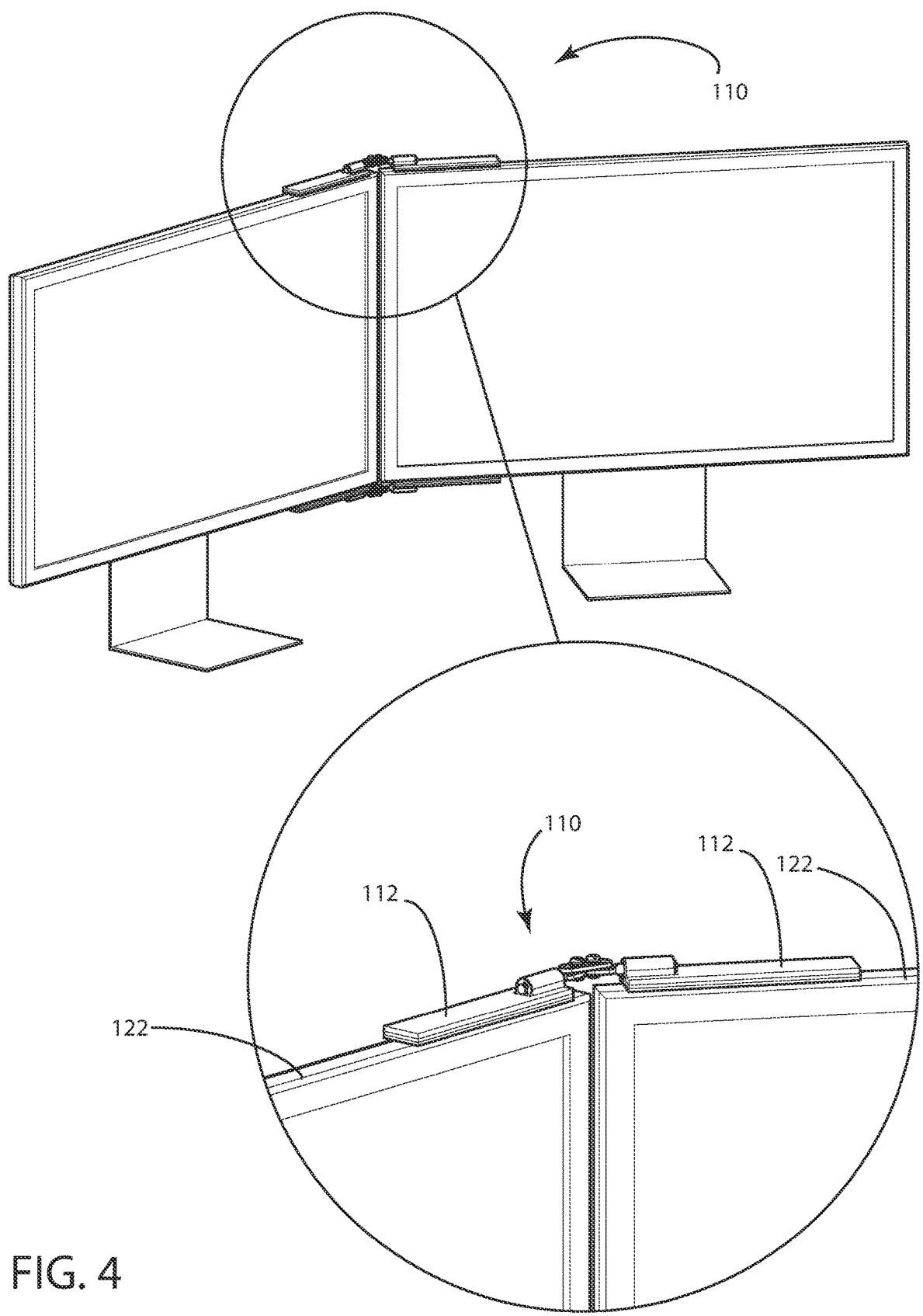
FIG. 4 is a perspective view of the example embodiment in situ.

FIGS. 3 and 4 show an example embodiment of the apparatus 110 in situ. In an example application, the apparatus 110 is affixed to the top edges of a pair of computer monitors 122, holding the monitor surfaces substantially coplanar. Braces 112 affix to the top edge of one of the monitors 122 and rods 116 (FIG. 2) are joined to the linking member 120 such that the braces 112 are collinear. One skilled in the art understands that this may keep the monitors 122 aligned across the top surface, and orient the monitor surfaces to be coplanar. In FIG. 4 the braces 112 are each affixed to the top edge of one of the two monitors 122 in such a manner as to hold the monitors evenly across the top, with the monitor visual display surfaces at similar angles to each other. One skilled in the art understands that an apparatus 110 may be affixed to the top of the monitors 122, bottom of the monitors 122 or both top and bottom of the monitors 122.

Figure 5:
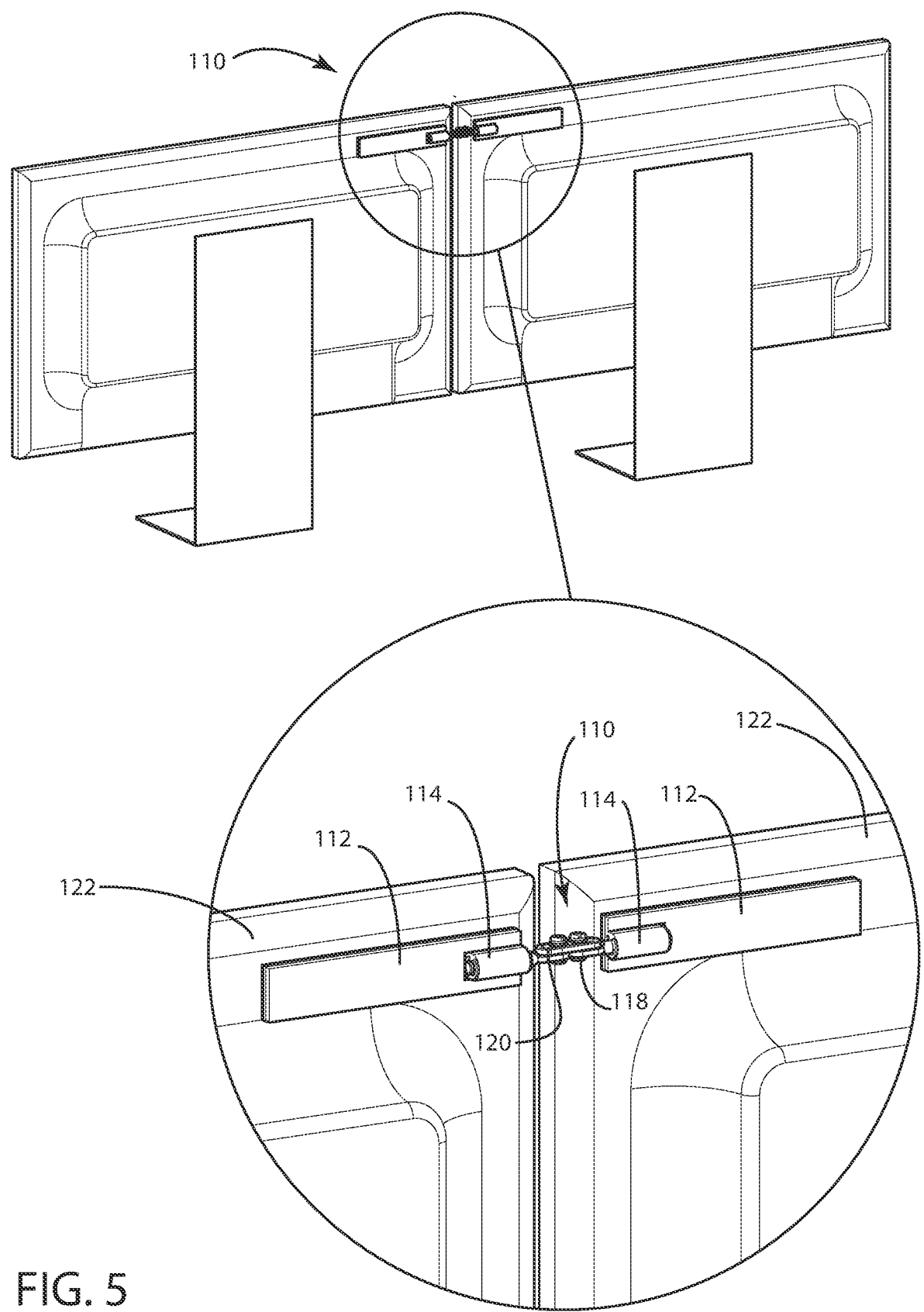
FIG. 5 is a perspective view of the example embodiment in situ.

FIG. 5 shows an alternative application. The apparatus 110 is shown with braces 112 affixed to the backs of the monitors 122. One skilled in the art understands that the rods 116 (FIG. 2) may rotate in the through-holes 114 so that the braces 112 may be positioned to be affixed to the back surface of the monitors 122 such that the linking member 120 may reside in a horizontal orientation such that the pivot axis through the fasteners 118 is vertical. One skilled in the art understands that in this manner the monitors may be positioned with visual display surfaces planar or at similar angles, and that the top edges of the monitors may be held in a parallel orientation.

These example embodiments should not be construed as limiting.

The invention claimed is:

1. An apparatus for joining and aligning flat objects comprising:
    a first brace;
    a first rod having a cylindrical portion and a flat portion; said cylindrical portion being rotationally engaged with said first brace;
    a second brace;
    a second rod having a cylindrical portion and a flat portion; said cylindrical portion being rotationally engaged with said second brace;
    said first brace and said first rod are arranged symmetrically with respect to said second brace and said second rod;
    a linking member having at least one flat surface and a long slot therethrough;
    said first brace and first rod are affixed to a first visual display and said second brace and second rod are affixed to a second visual display to align and join said visual displays through said linking member to form a central planar joint; and said apparatus is configured to join and align flat objects in three degrees of freedom.

2. The apparatus of claim 1 wherein a first brace and a first rod are arranged symmetrically with respect to a second brace and a second rod, about said linking member; and at least one fastener joins said flat portion of said first rod and said second rod to said linking member; wherein said first brace and first rod are affixed to a first visual display and said second brace and second rod are affixed to a second visual display to align and join the visual displays.

3. An apparatus for aligning objects comprising:

a first brace; and a first rod having a cylindrical portion and a flat portion, the flat portion comprising a top flat surface and a bottom flat surface, the top and bottom flat surfaces having a through-hole perpendicular to said flat surfaces; and said cylindrical portion being rotationally engaged with said first brace; and a linking member having at least one flat surface and a long slot therethrough; and said first rod, flat portion, and top flat surface movably engaged with said at least one flat surface of said linking member; and a first fastener passing through said hole in said flat portion of said first rod and through said slot in said linking member; and a second brace, a second rod and a second fastener arranged symmetrically about said linking member; wherein said first and second braces may each be affixed to a surface of a visual display, and the rods and linking member and fasteners may be moved and fastened to hold a relative position between said visual displays.

4. The apparatus of claim 3 wherein said first brace and said second brace has a removable adhesive on one side.

5. The apparatus of claim 3 wherein said brace further comprises at least one through-hole for housing the cylindrical portion of said central planar joint.

* * * * *